US011761817B2

(12) United States Patent
Xu

(10) Patent No.: US 11,761,817 B2
(45) Date of Patent: Sep. 19, 2023

(54) OPTICAL SENSOR ARRANGEMENT INCLUDING A DUMMY PHOTODIODE WITH A WELL THAT SURROUNDS A WELL OF A PHOTODIODE

(71) Applicant: ams International AG, Rapperswil (CH)

(72) Inventor: Gonggui Xu, Plano, TX (US)

(73) Assignee: AMS INTERNATIONAL AG, Rapperswil (CH)

( * ) Notice: Subject to any disclaimer, the term of this patent is extended or adjusted under 35 U.S.C. 154(b) by 843 days.

(21) Appl. No.: 16/321,578

(22) PCT Filed: Aug. 1, 2017

(86) PCT No.: PCT/EP2017/069420
§ 371 (c)(1),
(2) Date: Jan. 29, 2019

(87) PCT Pub. No.: WO2018/029039
PCT Pub. Date: Feb. 15, 2018

(65) Prior Publication Data
US 2020/0355549 A1 Nov. 12, 2020

Related U.S. Application Data

(60) Provisional application No. 62/372,392, filed on Aug. 9, 2016.

(30) Foreign Application Priority Data

Sep. 19, 2016 (EP) .................................... 16189462

(51) Int. Cl.
*G01J 1/42* (2006.01)
*H03M 1/12* (2006.01)
(Continued)

(52) U.S. Cl.
CPC .......... *G01J 1/4204* (2013.01); *G01J 1/4228* (2013.01); *G01J 1/46* (2013.01); *H03M 1/12* (2013.01);
(Continued)

(58) Field of Classification Search
CPC .......... G01J 1/4204; G01J 1/4228; G01J 1/46; G01J 2001/4233; G01J 2001/4426; G01J 2001/446; H03M 1/12
See application file for complete search history.

(56) References Cited

U.S. PATENT DOCUMENTS 7,541,964 B2  6/2009  Peizerat
9,148,094 B1*  9/2015  Swoboda .................. H03F 3/08
(Continued)

FOREIGN PATENT DOCUMENTS

CN  1936810 A  3/2007
CN  101329199 A  12/2008
(Continued)

OTHER PUBLICATIONS

European Patent Office, International Search Report for PCT/EP2017/069420 dated Oct. 19. 2017.
(Continued)

*Primary Examiner* — Jennifer D Bennett
(74) *Attorney, Agent, or Firm* — MH2 TECHNOLOGY LAW GROUP LLP

(57) ABSTRACT

An optical sensor arrangement includes a photodiode, a dummy photodiode, an analog-to-digital converter, a first switch which couples the photodiode to an input of the analog-to-digital converter, and a second switch which couples the dummy photodiode to the input of the analog-to-digital converter.

11 Claims, 5 Drawing Sheets

(51) Int. Cl.
   *G01J 1/44* (2006.01)
   *G01J 1/46* (2006.01)
(52) U.S. Cl.
   CPC . *G01J 2001/4233* (2013.01); *G01J 2001/446* (2013.01); *G01J 2001/4426* (2013.01)

(56) References Cited

U.S. PATENT DOCUMENTS

| | | | |
|---|---|---|---|
| 2004/0089790 A1* | 5/2004 | Rubin | H01L 27/1446 257/E27.129 |
| 2006/0274056 A1 | 12/2006 | Saravanan et al. | |
| 2008/0237453 A1* | 10/2008 | Chen | G01J 3/52 257/E27.128 |
| 2008/0251721 A1 | 10/2008 | Ueno | |
| 2010/0060562 A1 | 1/2010 | Hadwen et al. | |
| 2010/0193692 A1 | 8/2010 | Mori et al. | |
| 2010/0253616 A1* | 10/2010 | Omi | G01J 1/0209 250/214 R |
| 2011/0102391 A1* | 5/2011 | Park | G09G 3/20 345/207 |
| 2014/0117215 A1 | 5/2014 | Zu et al. | |
| 2014/0138784 A1* | 5/2014 | Dyer | H01L 31/0232 438/69 |
| 2014/0252212 A1 | 9/2014 | Xu et al. | |
| 2014/0263972 A1* | 9/2014 | Chua | H01L 27/1443 250/208.2 |
| 2014/0267202 A1* | 9/2014 | Zheng | G09G 5/10 345/207 |
| 2015/0083896 A1 | 3/2015 | Xu | |
| 2015/0102209 A1 | 4/2015 | Xu | |
| 2015/0377698 A1 | 12/2015 | Xu | |
| 2017/0068118 A1* | 3/2017 | Schweickert | H04N 5/361 |
| 2017/0328767 A1* | 11/2017 | Zheng | G01J 1/44 |

FOREIGN PATENT DOCUMENTS

| | | |
|---|---|---|
| CN | 101589477 A | 11/2009 |
| CN | 103954819 A | 7/2014 |
| EP | 1860778 | 11/2007 |
| EP | 2863192 | 4/2015 |
| GB | 2426814 | 12/2006 |
| JP | 2000252507 A | 9/2000 |
| JP | 2014011295 A | 1/2014 |
| WO | 2008/130060 | 10/2008 |

OTHER PUBLICATIONS

MAX44006/MAX44008, Maxim Integrated, RGB Color, Infrared, and Temperature Sensors, pp. 1-26, (2012) www.maximintegrated.com.
Chinese Office Action dated Mar. 1, 2021 for corresponding CN Application No. 201780047795.3, (Duyang Wang), 18 pages.
China National Intellectual Property Administration, Office Action issued in Chinese Application No. 201780047795.3, dated May 29, 2020 (with English Translation), 19 pages.
European Communication pursuant to Article 94(3) EPC issued is corresponding European Patent Application No. 16189462.1 dated Jan. 27, 2023, 4 pages.

* cited by examiner

OPTICAL SENSOR ARRANGEMENT INCLUDING A DUMMY PHOTODIODE WITH A WELL THAT SURROUNDS A WELL OF A PHOTODIODE

BACKGROUND OF THE INVENTION

The present patent application is related to an optical sensor arrangement and to a method for optical sensing.

An optical sensor arrangement often comprises a light sensor such as a photodiode and an analog-to-digital converter, wherein the photodiode provides a photodiode current to the analog-to-digital converter. However, the photodiode current may comprise a part that is independent from the light received by the photodiode and may be caused by leakage.

SUMMARY OF THE INVENTION

In an embodiment, an optical sensor arrangement comprises a photodiode, a dummy photodiode, an analog-to-digital converter as well as a first and a second switch. The first switch couples the photodiode to an input of the analog-to-digital converter. Moreover, the second switch couples the dummy photodiode to the input of the analog-to-digital converter.

Advantageously, a photodiode current provided by the photodiode comprises a leakage current and a photon current generated by photons. Moreover, a dummy current generated by the dummy photodiode mainly consists of a leakage current. The photodiode and the dummy photodiode are selectively connected to the input of the analog-to-digital converter. Thus, the photodiode current and the dummy current are measured separately by the identical analog-to-digital converter. The digital values of the photodiode current and of the dummy current can be used to reduce the influence of the leakage current on the measurement result of the optical sensor arrangement.

In an embodiment, the first switch is set in a conducting state in a measurement phase and in a non-conducting state in a reference phase. Moreover, the second switch is set in a conducting state in the reference phase and in a non-conducting state in the measurement phase.

In an embodiment, the optical sensor arrangement comprises a third switch which couples the photodiode to a reference potential terminal and a fourth switch which couples the dummy photodiode to the reference potential terminal.

In an embodiment, the third switch is set in a conducting state in the reference phase and in a non-conducting state in the measurement phase. Moreover, the fourth switch is set in a conducting state in the measurement phase and in a non-conducting state in the reference phase.

In an embodiment, the analog-to-digital converter is realized as a charge balancing analog-to-digital converter.

In a further development, the analog-to-digital converter comprises an amplifier, an integrating capacitor, a comparator and a reference capacitor circuit. A charge provided to an input of the amplifier e.g. provided by a dummy current of the dummy photodiode and/or a photodiode current of the photodiode is balanced by a charge packet or more than one charge packets provided by the reference capacitor circuit to the input of the amplifier.

In an embodiment, the analog-to-digital converter generates a digital output signal with a first value representing a value of the dummy current of the dummy photodiode in the reference phase and generates the digital output signal with a second value representing a value of the photodiode current of the photodiode in the measurement phase. The second value may be determined after the first value. Alternatively, the second value may be determined before the first value.

In an embodiment, the analog-to-digital converter comprises an amplifier with an input and an output.

In an embodiment, the first and the second switch are coupled to the input of the amplifier via the input of the analog-to-digital converter.

In an embodiment, the analog-to-digital converter comprises an input switch that couples the input of the amplifier to the reference potential terminal.

In an embodiment, the analog-to-digital converter comprises an integrating capacitor which is arranged between the output of the amplifier and the input of the amplifier.

In an embodiment, the analog-to-digital converter comprises an initialization switch that couples an electrode of the integrating capacitor to a voltage terminal.

In an embodiment, the analog-to-digital converter comprises an open loop switch that couples the electrode of the integrating capacitor to the output of the amplifier.

In an embodiment, the analog-to-digital converter comprises a comparator having an input that is connected to the output of the amplifier.

In an embodiment, the analog-to-digital converter comprises a reference capacitor circuit which is coupled to the input of the amplifier and provides a charge packet to the input of the amplifier.

In an embodiment, the optical sensor arrangement comprises at least a further photodiode, at least a further analog-to-digital converter, at least a further first switch which couples the at least a further photodiode to an input of the at least a further analog-to-digital converter and at least a further second switch which couples the dummy photodiode or at least a further dummy photodiode to the input of the at least a further analog-to-digital converter.

In an embodiment, the dummy photodiode is implemented as an additional photodiode. The additional photodiode is covered by a light-shielding cover. The light-shielding cover may be directly arranged on top of the dummy photodiode.

An area or size of the dummy photodiode may be identical with an area or size of the photodiode. The area or size of the dummy photodiode may also be identical with an area or size of the at least a further photodiode.

In an alternative embodiment, an area or size of the dummy photodiode may be different from an area or size of the photodiode or an area or size of the at least a further photodiode.

In a further development, an area or size of the dummy photodiode may be smaller than an area or size of the photodiode.

In an embodiment, the analog-to-digital converter generates a digital output signal with a first value as a function of the dummy current and the digital output signal with a second value as a function of the photodiode current. The second value may be determined before or after the first value. The first and the second values of the digital output signal may be provided to a logic circuit. In the case of an equal size of the photodiode and of the dummy photodiode, the logic circuit calculates an optical signal by subtracting the first value of the digital output signal from the second value of the digital output signal. In the case of different areas or sizes of the photodiode and of the dummy photodiode, the logic circuit calculates the optical signal by multiplying the first value of the digital output signal by a factor and then subtracting the result from the second value of the digital output signal.

In an embodiment, a method for optical sensing comprises generating a dummy current by a dummy photodiode, providing the dummy current to an analog-to-digital converter in a reference phase, and determining a first value of a digital output signal as a function of the dummy current by the analog-to-digital converter. The method comprises generating a photodiode current by a photodiode, providing the photodiode current to the analog-to-digital converter in a measurement phase, and determining a second value of the digital output signal as a function of the photodiode current by the analog-to-digital converter.

Advantageously, a leakage current can be determined by the dummy photodiode and the photodiode current of the photodiode can be corrected using the value of the leakage current.

In an embodiment, the optical sensor arrangement is realized as a light sensor for low dark count.

In an embodiment, the dummy photodiode is implemented as an additional photodiode that is covered by a light shielding cover.

In an embodiment, in the measurement phase, at least a further digital output signal with a second value representing at least a further photodiode current of at least a further photodiode is determined by at least a further analog-to-digital converter.

In a further development, in at least a further reference phase, the dummy photodiode provides the dummy photocurrent to the at least a further analog-to-digital converter. Thus, in the at least a further reference phase, at least a further digital output signal with a first value representing the dummy current of the dummy photodiode is determined by the at least a further analog-to-digital converter.

In an embodiment, in the measurement phase, the dummy current of the dummy photodiode is provided to at least a further analog-to-digital converter. Thus, in the measurement phase, at least a further digital output signal with a first value representing the dummy current of the dummy photodiode is determined by the at least a further analog-to-digital converter.

In a further development, in the reference phase, at least a further photodiode current of at least a further photodiode is applied to the at least a further analog-to-digital converter. Thus, in the reference phase, at least a further digital output signal with a second value representing at least the further photodiode current of the at least a further photodiode is determined by the at least a further analog-to-digital converter.

In an embodiment, the digital signal processor generates a further optical output signal which is a function of the first and the second value of the further digital output signal.

In an embodiment, the optical sensor arrangement has an application e.g. in consumer electronics. The optical sensor arrangement may be realized as an ambient light sensor, abbreviated ALS. One application may be the display management, where the optical sensor arrangement can be used to measure the ambient light brightness. If the ambient light is bright, a higher backlight illumination for a display panel is needed. If the ambient light is dark, a lower backlight illumination for the display panel is enough. By dynamically adjusting the display panel brightness, the optical sensor arrangement helps the display panel to optimize the operation power.

The optical sensor arrangement realizing the ambient light sensor may be buried underneath a dark glass, for example, in mobile phone applications, for a stylish fashion. In order to get more signal from weak incident light, a larger sense area may be used. However, larger sense area might increase intrinsic leakage current and might limit the low light measurement. The optical sensor arrangement may realize an ambient light sensor architecture with the capability to measure low light.

BRIEF DESCRIPTION OF THE DRAWINGS

The following description of figures of exemplary embodiments may further illustrate and explain aspects of the application. Devices and circuit parts with the same structure and the same effect, respectively, appear with equivalent reference symbols. In so far as devices or circuit parts correspond to one another in terms of their function in different figures, the description thereof is not repeated for each of the following figures.

DETAILED DESCRIPTION

Figure 1A:
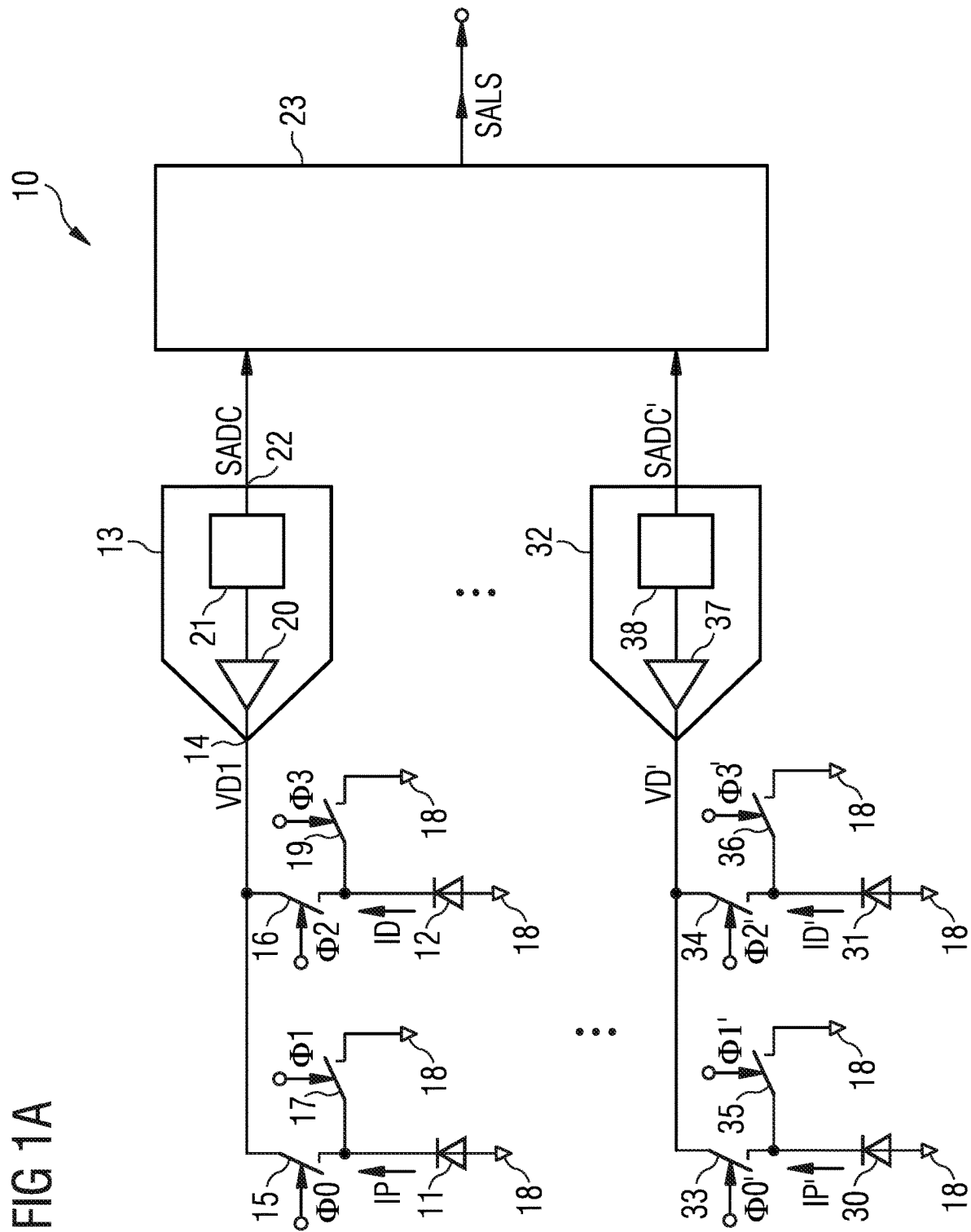
FIGS. 1A and 1B show exemplary embodiments of an optical sensor arrangement.

FIG. 1A shows an exemplary embodiment of an optical sensor arrangement 10 comprising a photodiode 11, a dummy photodiode 12 and an analog-to-digital converter 13, abbreviated AD converter. The photodiode 11 and the dummy photodiode 12 are both coupled to an input 14 of the AD converter 13. The optical sensor arrangement 10 comprises a first switch 15 which is arranged between the photodiode 11 and the input 14 of the AD converter 13. Moreover, the optical sensor arrangement 10 comprises a second switch 16 that is arranged between the dummy photodiode 12 and the input 14 of the AD converter 13. Additionally, a third switch 17 of the optical sensor arrangement 10 couples the photodiode 11 to a reference potential terminal 18. A fourth switch 19 of the optical sensor arrangement 10 couples the dummy photodiode 12 to the reference potential terminal 18. The AD converter 13 may comprise an amplifier unit 20 and an analog-to-digital converter unit 21 that are connected in series between the input 14 of the AD converter 13 and a signal output 22 of the AD converter 13.

Moreover, the optical sensor arrangement 10 comprises a digital signal processor 23 having an input connected to the signal output 22 of the AD converter 13.

Additionally, the optical sensor arrangement 10 comprises at least a further photodiode 30, at least a further dummy photodiode 31, at least a further analog-to-digital converter 32, at least a further first switch 33 and at least a further second switch 34. Moreover, the optical sensor arrangement 10 may comprise at least a further third switch 35 coupling the at least a further photodiode 30 to the reference potential terminal 18 and at least a further fourth switch 36 coupling the at least a further dummy photodiode 31 to the reference potential terminal 18. The at least a further analog-to-digital converter 32, abbreviated the at least a further AD converter, comprises a series circuit of at least a further amplifier unit 37 and at least a further analog-to-digital converter unit 38 that are connected in series between an input of the at least a further AD converter 32 and an output of the at least a further AD converter 32.

The dots shown in FIG. 1A indicate that the optical sensor arrangement 10 may comprise two photodiodes 11, 30 and two dummy photodiodes 12, 31 or more than two photodiodes 11, 30 and more than two dummy photodiodes 12, 31 and the corresponding switches and AD converters.

The photodiode 11 provides a photodiode current IP, whereas the dummy photodiode 12 provides a dummy current ID. In a measurement phase, the first switch 15 is set in a conducting state and the third switch 17 is set in a non-conducting state. Thus, the photodiode current IP is provided to the input 14 of the AD converter 13 in the measurement phase.

In the measurement phase, the second switch 16 is set in a non-conducting state and the fourth switch 19 is set in a conducting state. Thus, in the measurement phase, the dummy current ID is provided from the dummy photodiode 12 to the reference potential terminal 18.

In a reference phase, the dummy current ID is applied to the input 14 of the AD converter 13. Thus, in the reference phase, the second switch 16 is set in a conducting state and the fourth switch 19 is set in a non-conducting state.

Moreover, in the reference phase, the first switch 15 is set in a non-conducting state and the third switch 17 is set in a conducting state. Thus, the photodiode 11 provides the photodiode current IP to the reference potential terminal 18 in the reference phase.

The AD converter 13 generates a digital output signal SADC. At the end of the reference phase, the digital output signal SADC is provided with a first value representing the value of the dummy current ID. At the end of the measurement phase, the digital output signal SADC is generated with a second value representing the value of the photodiode current IP. The digital output signal SADC is applied to the input of the digital signal processor 23.

The digital signal processor 23 generates an optical output signal SALS. This optical output signal SALS represents an ambient light sensor reading. The optical output signal SALS is a function of the first and the second value of the digital output signal SADC.

In the reference phase, at least a further digital output signal SADC' with a first value representing a dummy current ID' of the at least a further dummy photodiode 31 may be determined. Correspondingly, in the measurement phase, at least the further digital output signal SADC' with a second value representing a photodiode current IP' of the at least a further photodiode 30 may be determined.

Thus, the measurement of the several photodiodes 11, 30 may be performed in parallel. Also the detection of the dummy currents ID, ID' of the several dummy photodiodes 12, 31 may be performed in parallel.

The optical sensor arrangement 10 comprises at least two channels that may be realized identical or similar. Each channel comprises a photodiode 11, 30, an AD converter 13, 32, a first switch 15, 33, a second switch 16, 34 and a third switch 17, 35. Each channel may comprise a dummy photodiode 12, 31 and a fourth switch 19, 36.

In FIG. 1A, the optical sensor arrangement 10 shows a light sensor architecture. Each channel of the optical sensor arrangement 10 is calibrated by itself individually for better accuracy. For each channel, the matched covered dummy photodiode 12, 31 is used first to measure the voltage across its photodiode and channel's dark count is calibrated first. Then during normal ambient light measurement, each measured dark count will be used to compensate its corresponding normal ambient light measurement for each channel.

Different input voltages VD1, VD' are measured across each photodiode 11, 30 (VD1 for the first channel, VD' for the at least a further channel). Even though each voltage (VD1 to VD') across each photodiodes 11, 30 is minimized by a separate offset DAC correction, the residue voltage still remains and can be different from channel to channel. This voltage difference (VD1-VD') across different photodiodes 11, 30 may cause a dark count difference. Since each channel has individual voltage and dark count measurement, the dark count compensation will become accurate and lower light measurement becomes possible.

For each channel, the dummy photodiode 12, 31 and the photodiode 11, 30 may be identical except that the dummy photodiode 12, 31 is not visible to incident light (including invisible spectrum, for example infrared light). Parameters, area/perimeter/junction-type for example, of the dummy photodiode 12, 31 may be exact the same as the photodiode 11, 30 such that the leakage current is identical. Also, since transistor switches associated to diode connections are also leaky, matching between the first and the third switch 15, 17 and the second and the fourth switch 16, 19 may optionally be realized.

In an alternative, not shown embodiment, the measurement phase of the photodiode 11 may be different from the measurement phase of the at least a further photodiode 30. Also, the reference phase used for the measurement of the dummy photodiode 12 may be different from the reference phase of the at least a further dummy photodiode 31.

In an alternative, not shown embodiment, the optical sensor arrangement 10 only comprises one photodiode, namely the photodiode 11, only one dummy photodiode, namely the photodiode 12 and only one AD converter, namely the AD converter 13 and the corresponding switches.

Figure 1B:
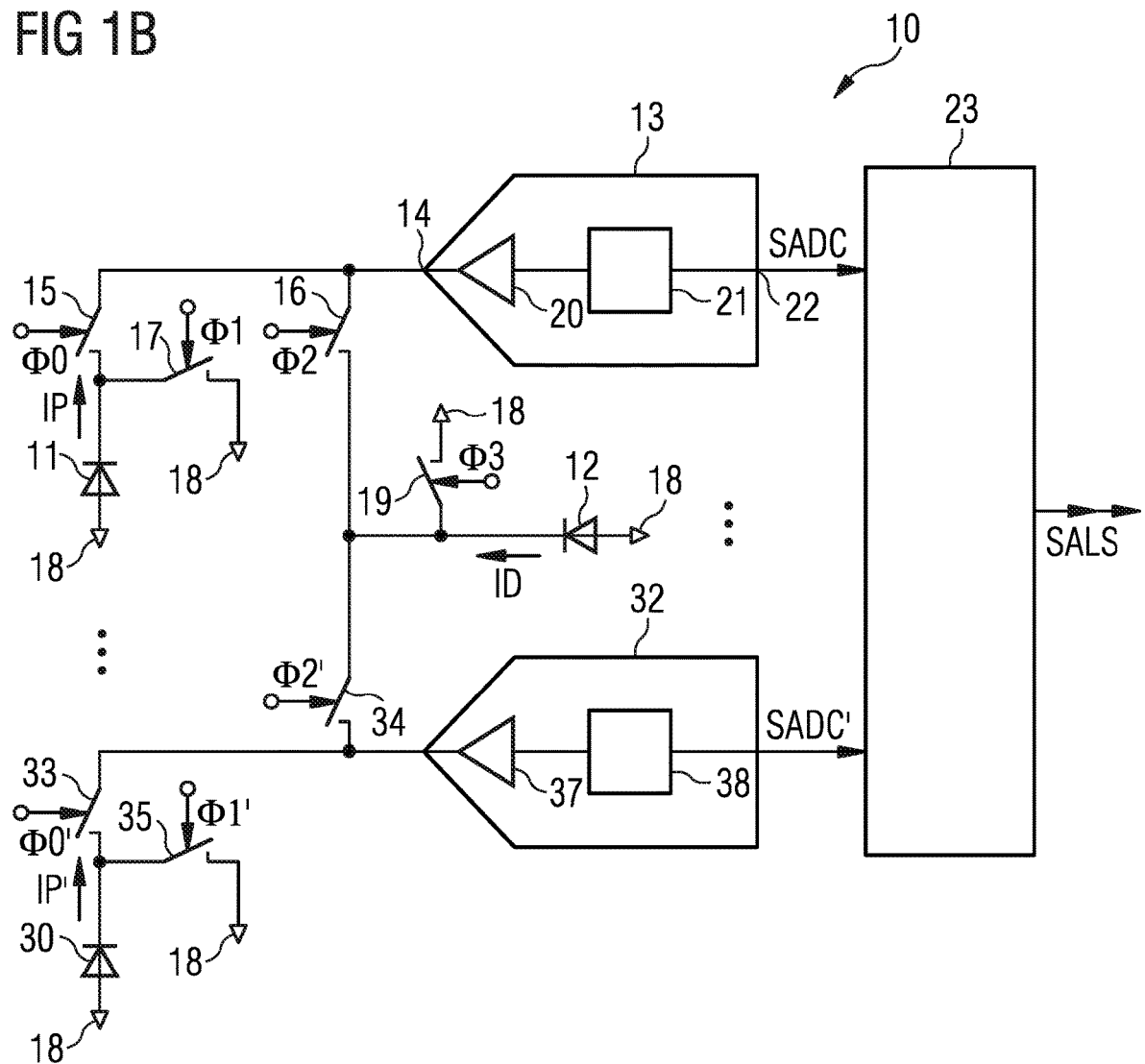

FIG. 1B shows a further exemplary embodiment of the optical sensor arrangement 10 that is a further development of the embodiment shown in FIG. 1A. In the optical sensor arrangement 10 shown in FIG. 1B, the at least a further dummy photodiode 31 is omitted. Thus, the dummy photodiode 12 is used for referencing the photodiode 11 and the at least a further photodiode 30. The dummy photodiode 12 is coupled via the at least a further second switch 34 to the input of the at least a further AD converter 32. The photodiode 11 and the at least a further photodiode 30 may be both measured in the measurement phase. Thus, at the end of the measurement phase, the AD converter 13 generates the digital output signal SADC with a second value that is a function of the photodiode current IP of the photodiode 11 and in parallel the at least a further AD converter 32 generates the digital output signal SADC' representing the photodiode current IP' of the at least a further photodiode 30. In that case, the dummy photodiode 12 provides the dummy photocurrent ID to the AD converter 13 in the reference phase and to the at least a further AD converter 32 in at least a further reference phase.

Alternatively, in the measurement phase while the photocurrent IP is provided to the AD converter 13, the dummy current ID is provided to the at least a further AD converter 32. Correspondingly, in the reference phase, while the dummy current ID is provided to the AD converter 13, the at least a further photodiode current IP' is applied to the at least a further AD converter 32.

The channels may be realized identical or similar. Each channel comprises a photodiode 11, 30, an AD converter 13, 32, a first switch 15, 33, a second switch 16, 34 and a third switch 17, 35. The dummy photodiode 12 and the fourth switch 19 are shared between at least two channels.

Figure 2A:
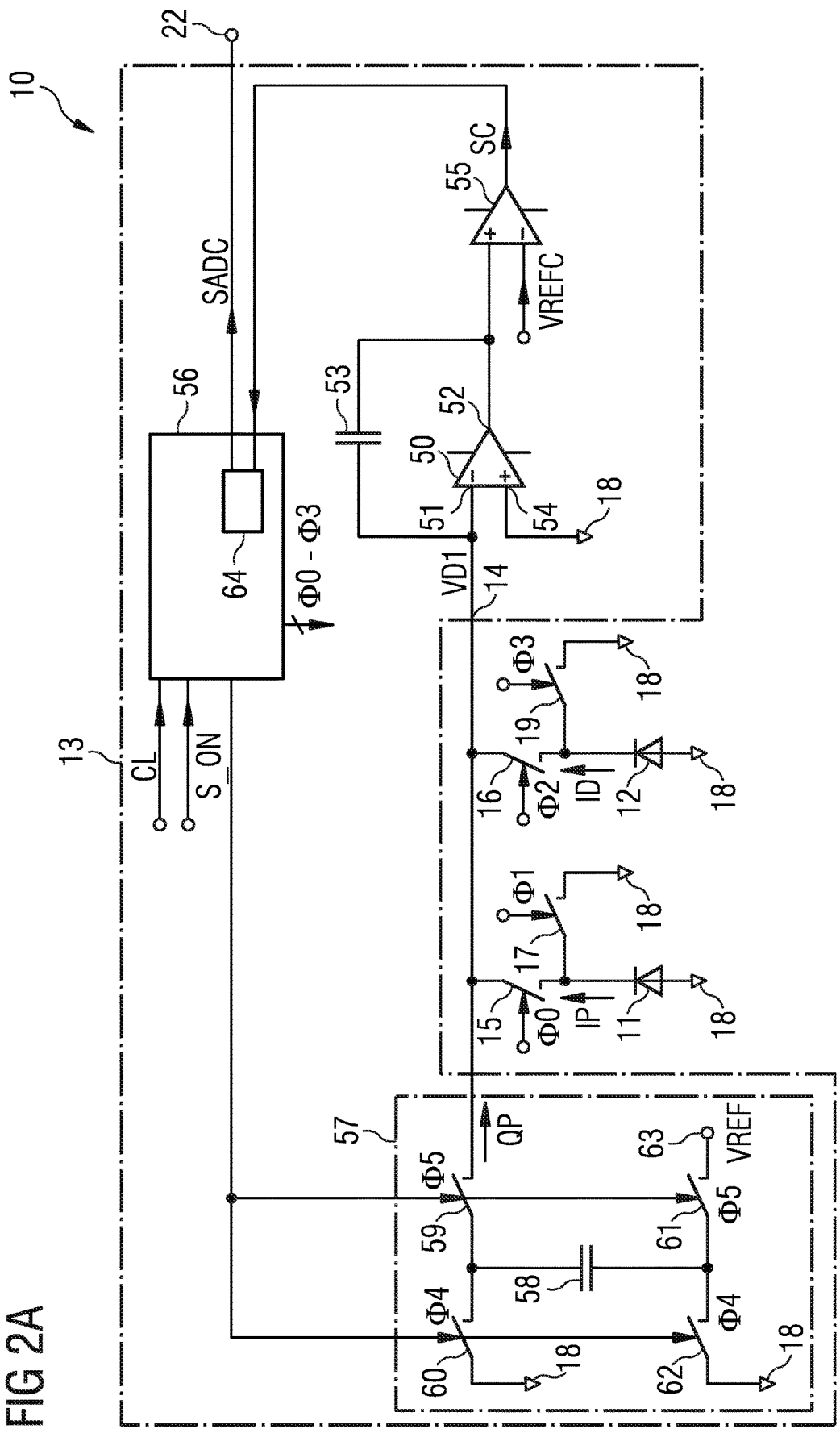
FIGS. 2A and 2B show further exemplary embodiments of an optical sensor arrangement.
Figure 2B:
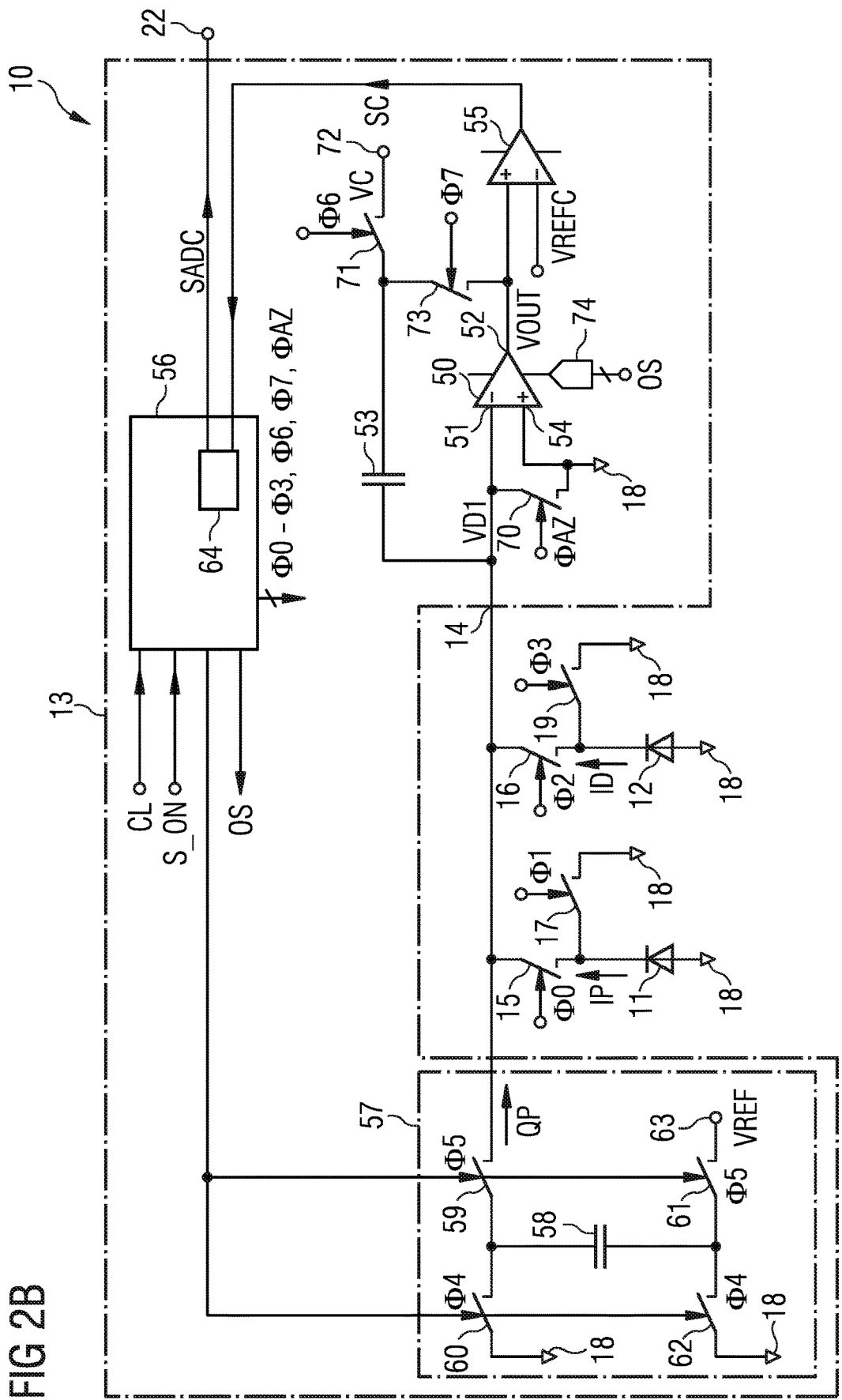

The further AD converter 32 may be realized such as the AD converter 13 shown in FIG. 2A or 2B.

In FIG. 1B, the calibration covered dummy photodiode 12 is shared among channels. The benefit is the saved area on dummy photodiodes 12, 31. In certain applications, the normal photodiode 11, 30 might be different from channel to channel. In that case, calibration reading of dark counts from the shared dummy photodiode 12 has to be scaled accordingly for proper compensation for each channel.

FIG. 2A shows a further exemplary embodiment of the optical sensor arrangement 10 which is a further development of the embodiments shown in FIGS. 1A and 1B. The AD converter 13 comprises an amplifier 50 having an input 51 and an output 52. The amplifier 50 may be realized as an operational amplifier. Moreover, the AD converter 13 comprises an integrating capacitor 53 that couples the input 51 of the amplifier 50 to the output 52 of the amplifier 50. The amplifier 50 and the integrating capacitor 53 form an integrator. The input 51 of the amplifier 50 is directly connected to the input 14 of the AD converter 13. Thus, the photodiode 11 is coupled via the first switch 15 and the input 14 of the AD converter 13 to the input 51 of the amplifier 50. Moreover, the dummy photodiode 12 is coupled via the second switch 16 and the input 14 of the AD converter 13 to the input 51 of the amplifier 50. The input 51 of the amplifier 50 may be realized as an inverting input.

An anode of the photodiode 11 and an anode of the dummy photodiode 12 are connected to the reference potential terminal 18. A cathode of the photodiode 11 is coupled via the first switch 15 to the input 51 of the amplifier 50. A cathode of the dummy photodiode 12 is coupled via the second switch 16 to the input 51 of the amplifier 50. The input 14 of the AD converter 13 may be named integration node.

The amplifier 50 may comprise a further input 54. The further input 54 may be connected to the reference potential terminal 18. The further input 54 of the amplifier 50 may be implemented as a non-inverting input.

Additionally, the AD converter 13 comprises a comparator 55 having an input connected to the output 52 of the amplifier 50. The input may be realized as a non-inverting input. Moreover, the comparator 55 comprises a further input. The further input may be realized as an inverting input. An output of the comparator 55 is connected to an input of a control logic 56 of the AD converter 13. An output of the control logic 56 is connected to the signal output 22 of the AD converter 13. The control logic 56 comprises a counter 64. The output of the comparator 55 is coupled via the counter 64 to the signal output 22.

Additionally, the AD converter 13 comprises a reference capacitor circuit 57. The reference capacitor circuit 57 may be realized as a charge packet circuit or charge package circuit. The reference capacitor circuit 57 comprises a reference capacitor 58 having a first and a second electrode. A first reference switch 59 of the reference capacitor circuit 57 couples the first electrode of the reference capacitor 58 to the input 51 of the amplifier 50. A second reference switch 60 couples the first electrode of the reference capacitor 58 to the reference potential terminal 18. Moreover, the reference capacitor circuit 57 comprises a third reference switch 61 coupling the second electrode of the reference capacitor 58 to a reference source terminal 63. Furthermore, a fourth reference switch 62 of the reference capacitor circuit 57 couples the second electrode of the reference capacitor 58 to the reference potential terminal 18.

Outputs of the control logic 56 are connected to the control terminals of the first to the fourth reference switch 59 to 62. Moreover, further outputs of the control logic 56 are connected to the control terminals of the first to the fourth switch 15, 16, 17, 19.

The input voltage VD1 is tapped at the input 51 of the amplifier 50. The amplifier 50 generates an output voltage VOUT that is provided to the input of the comparator 55. A comparator reference voltage VREFC is applied to the further input of the comparator 55. The comparator reference voltage VREFC sets a comparator switching point of the comparator 55. The comparator reference voltage VREFC may be equal to the switching point of the comparator 55. The comparator 55 generates a comparator signal SC. The comparator signal SC is provided to the control logic 56. The control logic 56 generates the digital output signal SADC at the signal output 22 as a function of the comparator signal SC. The comparator signal SC may be applied to the counter 64 which may generate the digital output signal SADC. The control logic 56 generates clock phases $\Phi 0$ to $\Phi 5$ and provide said clock phases to the control terminals of the switches 15 to 17, 19, 59 to 62. The control logic 56 receives a clock signal CL and generates the clock phases $\Phi 0$ to $\Phi 5$ as a function of the clock signal CL. A reference voltage VREF is applied to the reference source terminal 63. The reference capacitor 58 has the capacitance value CREF. The reference voltage VREF is applied between the two electrodes of the reference capacitor 58, when the reference capacitor 58 is charged.

The basic operation of FIG. 2A is that the charge balancing AD converter 13 collects the photodiode current IP from the photodiode 11 and converts it into the digital output signal SADC that may be named ALS count. The photodiode current IP comprises a photon current IPD and a leakage current ILEAK. The photodiode current IP follows the equation: IP=IPD+ILEAK. The photodiode current IP is integrated into the integrating capacitor 53 and the output voltage VOUT of the amplifier 50 is ramping up. If the output voltage VOUT is larger than the comparator reference voltage VREFC, the control logic 56 will increment the digital output signal SADC of the counter 64 and the charge on the integrating capacitor 53 will be decreased by one unit charge packet QP=CREF·VREF. By integrating the photodiode current IP in a certain amount of time, namely an integration time TINT (100 mS for example), the digital output signal SADC will have the second value depending on the brightness of ambient light and on the leakage current. The control logic 56 receives an enable signal S_ON.

The detailed electrical operation will be explained in the following. Initially when the enable signal S_ON is low: the photodiode 11 is cleared; the integrating capacitor 53 is cleared; the output voltage VOUT of the amplifier 50 is reset at a voltage lower than the comparator reference voltage VREFC; the comparator signal SC is low; the charge packet or charge package is fully charged to QP=CREF·VREF and disconnected from the input 14 of the AD converter 13; the digital output signal SADC is cleared to be 0.

When the enable signal S_ON is high, the photodiode current IP of the photodiode 11 is integrated into the integrating capacitor 53 and the output voltage VOUT is ramping up. When the output voltage VOUT is larger than the comparator reference voltage VREFC, the comparator signal SC is high and a charge packet QP=CREF·VREF, controlled by clock phases $\Phi 4$, $\Phi 5$, is dumped into the input 14 of the AD converter 13 and the digital output signal SADC will be incremented by one count. After the charge dumping, the output voltage VOUT is lower than the comparator reference voltage VREFC and the reference capacitor circuit 57 is disconnected from the input 51 of the amplifier 50 and back to recharging mode. Over a certain period of the integration time TINT, the number N_P of charge dumping, that is the second value of the digital output signal SADC (also named as ambient light count) will be generated according to the following charge conservation equation:

$$N\_P=(TINT \cdot IP)/(CREF \cdot VREF)$$

During a completely dark light condition, ideally, the photodiode 11 will not generate any current and the value of the digital output signal SADC is zero. In reality, however, if the voltage VD1 across the photodiode 11 is not zero, the photodiode 11 will be leaky and the leakage current ILEAK is:

$$ILEAK = IS \cdot \left[ e^{\frac{VD1}{\frac{kT}{q}}} - 1 \right];$$

wherein IS is the reverse bias saturation current, k is the Boltzmann constant, T is the absolute temperature of the junction of the photodiode 11 and q is the magnitude of charge of an electron.

The leakage current ILEAK grows exponentially over the temperature T. For example, a finite dark count (a dark count value of the digital output signal SADC when light is zero) can exist and limit sensor low bound performance:

$$N\_LEAK=(TINT \cdot ILEAK)/(CREF \cdot VREF)$$

In FIG. 2A, the dark count compensation for each channel is explained. The amplifier unit 20 shown in FIGS. 1A and 1B can be realized as a programmable gain amplifier, abbreviated PGA which can be implemented by different capacitance values CREF of the reference capacitor 58 and different values of the reference voltage VREF as shown in the following equation:

$$SADC=(TINT \cdot IP)/(CREF \cdot VREF)$$

While a normal photodiode 11 can have both the photon current IPD and the leakage current ILEAK, the dummy photodiode 12 can only have the leakage current ILEAK (assuming that the two diodes 11, 12 have same area, otherwise, a scale factor might be used for compensation) as the dummy photodiode 12 will be covered either by metal or black filter. If two separate integrations are done successively, a light sensing count can be achieved as following:

Step 1. The dummy photodiode 12 only is used for leakage collection:

$$N\_DUMMY=TINT \cdot ILEAK/(CREF \cdot VREF).$$

Step 2. The photodiode 11 only is used for photon current collection:

$$N\_P=TINT \cdot (IPD+ILEAK)/(CREF \cdot VREF) \text{ and}$$

$$IP=IPD+ILEAK.$$

Step 3: Differentiation:

$$SALS=N\_P-N\_DUMMY=TINT \cdot IPD/(CREF \cdot VREF).$$

The differentiation is performed by subtraction. The digital signal processor 23 may perform the subtraction. The optical sensor arrangement 10 uses a channel calibration scheme. The optical output signal SALS only depends on the photon current IPD.

The first to the fourth switches 15, 16, 17, 19 receive the clock phases Φ0 to Φ3. When the photodiode 11 is used for integration, the clock phases Φ0, Φ3 close the first and the fourth switch 15, 19 and the clock phases Φ1, Φ2 open the second and the third switch 16, 17. When the dummy photodiode 12 is used for integration, the clock phases Φ0, Φ3 open the first and the fourth switch 15, 19 and the clock phases Φ1, Φ2 close the second and the third switch 16, 17.

FIG. 2B shows a further exemplary embodiment of the optical sensor arrangement which is a further development of the embodiments shown in FIGS. 1A, 1B and 2A. The AD converter 13 comprises an input switch 70 that couples the input 51 of the amplifier 50 to the reference potential terminal 18. Moreover, an electrode of the integrating capacitor 53 is coupled via an initialization switch 71 to a voltage reference terminal 72. Additionally, the electrode of the integrating capacitor 53 is coupled via an open loop switch 73 to the output 52 of the amplifier 50. Thus, a series connection of the integrating capacitor 53 and of the open loop switch 73 couples the input 51 of the amplifier 50 to the output 52 of the amplifier 50. A node between the integrating capacitor 53 and the open loop switch 73 is coupled via the initialization switch 71 to the voltage reference terminal 72. An output of a digital-to-analog converter 74, abbreviated DA converter, is connected to a control terminal of the amplifier 50. An output of the control logic 56 is connected to an input of the DA converter 74. The AD converter 13 comprises the DA converter 74.

A terminal voltage VC is provided to the voltage reference terminal 72. The control logic 56 provides an offset digital-to-analog converter code OS, abbreviated offset DAC code and also named OSTRIM<10:0>, to the digital-to-analog converter 74 that supplies a control voltage to the amplifier 50. The amplifier 50 may be a programmable gain amplifier. A gain of the amplifier 50 may be set by the control voltage and, thus, by the offset DAC code OS.

In FIG. 2B, an auto-zero feature is added into the sensor architecture. Extra hardware is added in FIG. 2B in relation to FIG. 2A:

The offset DA converter 74 to minimize the offset at the virtual ground node VD1 of the amplifier 50. The DA converter 74 may be e.g. an 11-bit converter.

The input switch 70 controlled by the clock phase ΦAZ and arranged between the input 51 of the amplifier 50 and the reference potential terminal 18.

The initialization switch 71 controlled by the clock phase Φ6 for initialization of the integrating capacitor 53.

The open loop switch 73 controlled by the clock phase Φ7 for open loop auto-zero operation.

The dark count calibration/cancellation scheme for FIG. 2B is described as follows:

1. Minimize the offset of the amplifier 50 by an auto-zero procedure:

a. the first and the second switch 15, 16, the first and the fourth reference switch 59, 61 and the open loop switch 73 are set open that means in a non-conducting state by the clock phases Φ0, Φ2, Φ5, Φ7. The third and the fourth switch 17, 19, the second and the third reference switch 60, 62, the initializing switch 71 and the input switch 70 are closed that means are set in a conducting state by the clock phases Φ1, Φ3, β4, Φ6, ΦAZ.

b. Watch the output voltage VOUT of the amplifier 50:

i. If the output voltage VOUT is at a supply voltage VDD, the control logic 56 will decrease the offset DAC code OS by 1 count.

ii. If the output voltage VOUT is at ground, the control logic 56 will increase the offset DAC code OS by 1 count.

iii. Before the end of predefined number of iterations, the output voltage VOUT will be toggling between the supply voltage VDD and ground and optimum offset correction is achieved.

iv. The offset DAC code OS is loaded into a memory for next two integrations. The control logic 56 may comprise the memory.

2. To avoid negative dark count, the offset DAC code OS can be incremented by 1 or 2 steps such that the input voltage VD1 will be positive, when the amplifier 50 is in the closed loop.

3. The dummy photodiode 12 only is used for leakage current collection. The first and the fourth switch 15, 19, the initializing switch 71 and the input switch 70 are set open that means in a non-conducting state by the clock phases Φ0, Φ3, Φ6, ΦAZ. The second and the third switch 16, 17 and the open loop switch 73 are closed that means they are set in a conducting state by the clock phases Φ1, Φ2, Φ7. The digital output signal SADC has the first value N_DUMMY:

$$N\_DUMMY = TINT \cdot ILEAK/(CREF \cdot VREF).$$

4. The photodiode 11 only is used for normal photon current collection. The second and the third switch 16, 17, the initializing switch 71 and the input switch 70 are set open that means in a non-conducting state by the clock phases Φ1, Φ2, Φ6, βAZ. The first and the fourth switch 15, 19 and the open loop switch 73 are closed that means they are set in a conducting state by the clock phases Φ0, Φ, β7. The digital output signal SADC has the second value N_P:

$$N\_P = TINT \cdot (IPD + ILEAK)/(CREF \cdot VREF).$$

5. Differentiation by subtraction:

$$SALS = N\_P - N\_DUMMY = TINT \cdot IPD/(CREF \cdot VREF).$$

Thus, the optical output signal SALS is free from an influence of the leakage current ILEAK.

In an alternative, not shown embodiment, the reference capacitor 58 is controllable. The control logic 56 may select one capacitance value of at least two different capacitance values CREF of the reference capacitor 58.

In an alternative, not shown embodiment, the reference voltage VREF is controllable. The control logic 56 may select one value of at least two different values of the reference voltage VREF. Thus, a charge packet QP selectively has one of at least two different charge values.

Figure 3A:
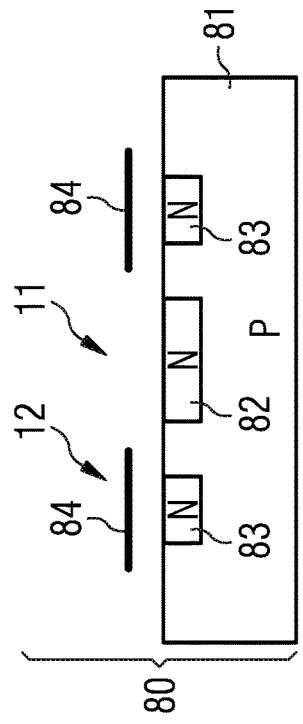
FIGS. 3A to 3D show an exemplary embodiment of a photodiode and a dummy photodiode.
Figure 3D:
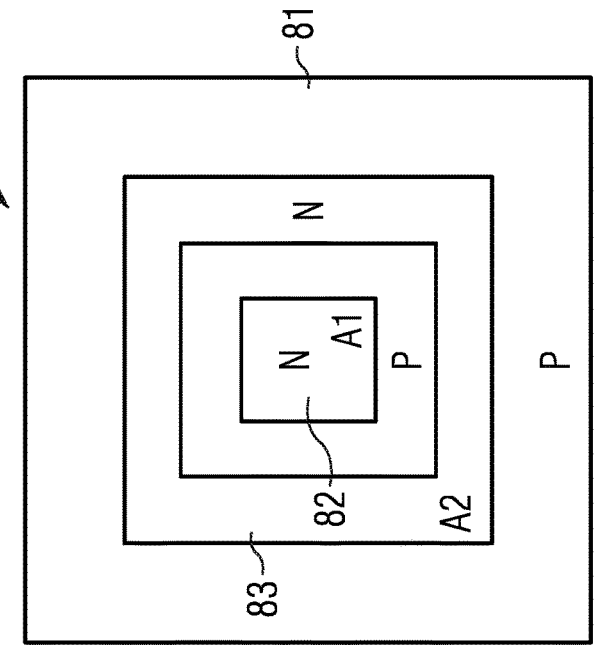
Figure 3C:
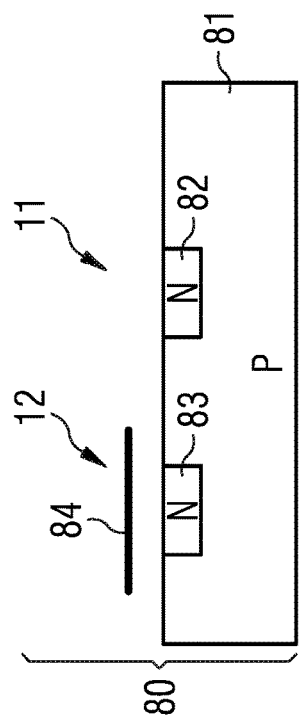
Figure 3B:
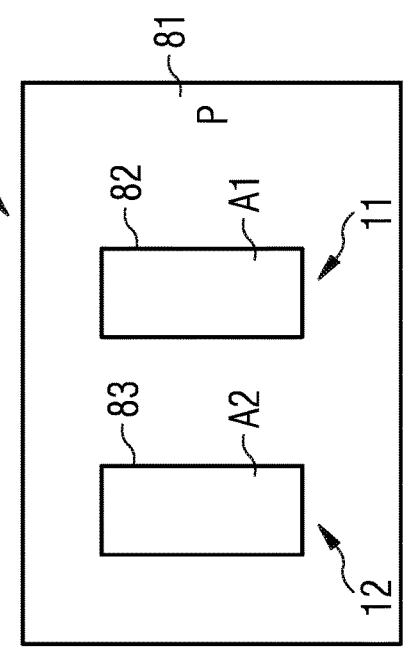

FIG. 3A shows a cross-section and FIG. 3B shows a top view of the photodiode 11 and the dummy photodiode 12 that may be used for the realization of the optical sensor arrangements shown in FIGS. 1A, 1B, 2A and 2B. The optical sensor arrangement 10 comprises a semiconductor body 80. The semiconductor body 80 comprises a substrate 81 in which a first and a second well 82, 83 are formed. The substrate 81 may be implemented as a p-substrate and the first and the second wells 82, 83 may be implemented as n-wells. The photodiode 11 comprises the first well 82 and the dummy photodiode 12 comprises the second well 83. The photodiode 11 and the dummy photodiode 12 comprise connection lines that are not shown in the cross-section in FIG. 3A.

The dummy photodiode 12 comprises a light-shielding cover 84 that is arranged above the second well 83. Thus, a light source or several light sources above the semiconductor body 80 can emit light that is absorbed and detected by the photodiode 11 and shielded by the light-shielding cover 84 thus that the dummy photodiode 12 does not detect this light. The light-shielding cover 84 may be a metal layer, a metal cover or a black filter. Whereas photons reach the first well 82, no photons or nearly no photons reach the second well 83. The first and the second well 82, 83 are realized by the same fabrication steps. Thus, the doping profile of the first well 82 is identical to the doping profile of the second well 83. The depth of the pn-junction between the first well 82 and the substrate 81 has the same value as the depth of the pn-junction between the second well 83 and the substrate 81.

As shown in FIG. 3B, a first area of the first well 82 and a second area of the second well 83 are rectangular. The areas may be named sense areas. A size A1 of the first area is identical to a size A2 of the second area. Since the doping profile and the areas in the top view of the first and the second well 82, 83 are identical, the electrical behavior of the photodiode 11 and of the dummy photodiode 12 are also identical. Thus, it can be expected that the leakage current ILEAK that is part of the photodiode current IP is identical with the dummy current ID. The optical output signal SALS can be calculated according to the following equation:

$$SALS = N\_P - N\_DUMMY;$$

wherein N_DUMMY is the first value of the digital output signal SADC and N_P is the second value of the digital output signal SADC.

Although the photodiode 11 and the dummy photodiode 12 can be implemented by different P-N junctions, in CMOS process, N-well diodes are optionally used for the photodiode 11 and the dummy photodiode 12 as its high junction depth is sensitive to the visible light spectrum.

For a typical semiconductor process, 10% matching error between two N-well photodiodes is expected. Therefore, for example, 10× improvement may be achieved. As the absorption depth of long wavelength light is quite long, therefore, some distance, 50 μm for example, should be used for extra light blockage for covered dummy photodiode 12 to reject long wavelength light sensing.

Normally, a smaller voltage VD1 across the photodiode 11 results in a smaller leakage current ILEAK. To make the cancellation as efficient as possible, an offset minimization procedure (called auto-zero process) may be performed before dark count calibration.

The optical sensor arrangement 10 achieves an efficient dark count calibration and cancellation scheme. The dark count can be reduced significantly for practical applications. The covered dummy photodiode 12 is used to measure different voltages across each ambient light diode 11, 30.

The voltage VD1 across each photodiode 11 and its dark count are measured channel by channel. Each channel's dark count information is used to compensate its corresponding normal light measurement. Since each channel has precise offset voltage and dark count compensation, this sensor architecture may be capable to measure low ambient light.

FIGS. 3C and 3D show an alternative embodiment of a cross-section and a top view of the photodiode 11 and the dummy photodiode 12 that is a further development of the above-shown embodiments. As can be seen in FIG. 3D, the second well 83 surrounds the first well 82. Thus, as shown in FIG. 3C, the second well 83 is on both sides of the first well 82. The first area has a size A1 different from a size A2 of the second area 86. The optical output signal SALS can be calculated according to the following equation:

$$SALS = N\_P - N\_DUMMY \cdot \frac{A1}{A2};$$

wherein N_P is the second value of the digital output signal SADC, N_DUMMY is the first value of the digital output signal SADC, A1 is the size of the first area of the first well 82 and A2 is the size of the second area of the second well 83. Since N-well shielding is sometimes surrounding the N-well photodiode 11, advantageously, part of the shielding N-well may be used as the calibration N-well dummy photodiode 12.

The optical sensor arrangement 10 realizes an ambient light sensor architecture. It achieves a dark count calibration and cancellation scheme.

The invention claimed is:

1. An optical sensor arrangement, comprising
a photodiode,
a dummy photodiode,
a charge balancing analog-to-digital converter,
a first switch which couples the photodiode to an input of the charge balancing analog-to-digital converter,
a second switch which couples the dummy photodiode to the input of the charge balancing analog-to-digital converter,
at least a further photodiode,
at least a further charge balancing analog-to-digital converter,
at least a further first switch which couples the further photodiode to an input of the further charge balancing analog-to-digital converter,
at least a further second switch which couples the dummy photodiode to the input of the further charge balancing analog-to-digital converter, and
a logic circuit,
wherein the charge balancing analog-to-digital converter is designed to generate a digital output signal with a first value representing a value of a dummy current of the dummy photodiode in a reference phase and to generate the digital output signal with a second value representing a value of a photodiode current of the photodiode in a measurement phase,
wherein the dummy photodiode is covered by a light shielding cover and wherein a second well of the dummy photodiode surrounds a first well of the photodiode, and
wherein the logic circuit is configured to calculate an optical signal by multiplying the first value of the digital output signal by a factor and then subtracting a result of the multiplying from the second value of the digital output signal.

2. The optical sensor arrangement according to claim 1, wherein the optical sensor arrangement comprises
a third switch which couples the photodiode to a reference potential terminal and
a fourth switch which couples the dummy photodiode to the reference potential terminal.

3. The optical sensor arrangement according to claim 1, wherein the charge balancing analog-to-digital converter comprises an amplifier with an input and an output and
wherein the first and the second switch are coupled to the input of the amplifier via the input of the charge balancing analog-to-digital converter.

4. The optical sensor arrangement according to claim 3, wherein the charge balancing analog-to-digital converter comprises an input switch that couples the input of the amplifier to a reference potential terminal.

5. The optical sensor arrangement according to claim 3, wherein the charge balancing analog-to-digital converter comprises an integrating capacitor which is arranged between the output of the amplifier and the input of the amplifier.

6. The optical sensor arrangement according to claim 5, wherein the charge balancing analog-to-digital converter comprises an initialization switch that couples an electrode of the integrating capacitor to a voltage terminal.

7. The optical sensor arrangement according to claim 5, wherein the charge balancing analog-to-digital converter comprises an open loop switch that couples an electrode of the integrating capacitor to the output of the amplifier.

8. The optical sensor arrangement according to claim 3, wherein the charge balancing analog-to-digital converter comprises a comparator having an input that is connected to the output of the amplifier.

9. The optical sensor arrangement according to claim 3, wherein the charge balancing analog-to-digital converter comprises a reference capacitor circuit which is coupled to the input of the amplifier and which is designed for providing a charge packet to the input of the amplifier.

10. A method for optical sensing, comprising
generating a dummy current by a dummy photodiode,
providing the dummy current to a charge balancing analog-to-digital converter in a reference phase,
determining a first value of a digital output signal as a function of the dummy current by the charge balancing analog-to-digital converter,
generating a photodiode current by a photodiode,
providing the photodiode current to the charge balancing analog-to-digital converter in a measurement phase,
determining a second value of the digital output signal as a function of the photodiode current by the charge balancing analog-to-digital converter, and
generating an optical signal by multiplying the first value of the digital output signal by a factor and then subtracting a result of the multiplying from the second value of the digital output signal,
wherein the dummy photodiode is covered by a light shielding cover and wherein a second well of the dummy photodiode surrounds a first well of the photodiode.

11. An optical sensor arrangement, comprising
a photodiode,
a dummy photodiode,
a charge balancing analog-to-digital converter,
a first switch which couples the photodiode to an input of the charge balancing analog-to-digital converter,
a second switch which couples the dummy photodiode to the input of the charge balancing analog-to-digital converter,
a logic circuit,
wherein the charge balancing analog-to-digital converter is designed to generate a digital output signal with a first value representing a value of a dummy current of the dummy photodiode in a reference phase and to generate the digital output signal with a second value representing a value of a photodiode current of the photodiode in a measurement phase,
wherein the dummy photodiode is covered by a light shielding cover and wherein a second well of the dummy photodiode surrounds a first well of the photodiode, and
wherein the logic circuit is configured to calculate an optical signal by multiplying the first value of the digital output signal by a factor and then subtracting a result of the multiplying from the second value of the digital output signal.

* * * * *